US005615219A

United States Patent [19]
Keating et al.

[11] Patent Number: 5,615,219
[45] Date of Patent: Mar. 25, 1997

[54] SYSTEM AND METHOD OF PROGRAMMING A MULTISTATION TESTING SYSTEM

[75] Inventors: Paul L. Keating, Winchester; Steven M. Blumenau, Royalston; Richard Pye, Waltham; William S. Schymik, Acton, all of Mass.

[73] Assignee: GenRad, Inc., Concord, Mass.

[21] Appl. No.: 552,141

[22] Filed: Nov. 2, 1995

[51] Int. Cl.[6] .......................... G01R 31/28; G06F 11/00
[52] U.S. Cl. ........................ 371/27; 364/500; 364/580; 364/579
[58] Field of Search .......................... 371/27, 21.1, 21.2, 371/21.3, 21.4, 21.5, 22.1, 22.2, 22.3, 22.5, 22.6, 24, 25.1; 364/579, 580, 551.01, 551.02, 552, 500; 395/183.01, 183.02

[56] References Cited

U.S. PATENT DOCUMENTS 5,046,033  9/1991  Andreasen et al. ................... 364/580
5,107,500  4/1992  Wakamoto et al. ............... 395/183.02

*Primary Examiner*—Hoa T. Nguyen
*Attorney, Agent, or Firm*—Cesari and McKenna

[57] ABSTRACT

A system for generating programs for a variety of testing stations. A program generator reads a common rule set to generate test instructions for an electrical tester, an optical inspector, and an x-ray inspector. Over time, the system collects defect data that may affect the triggering of certain rules in the rule set.

18 Claims, 13 Drawing Sheets

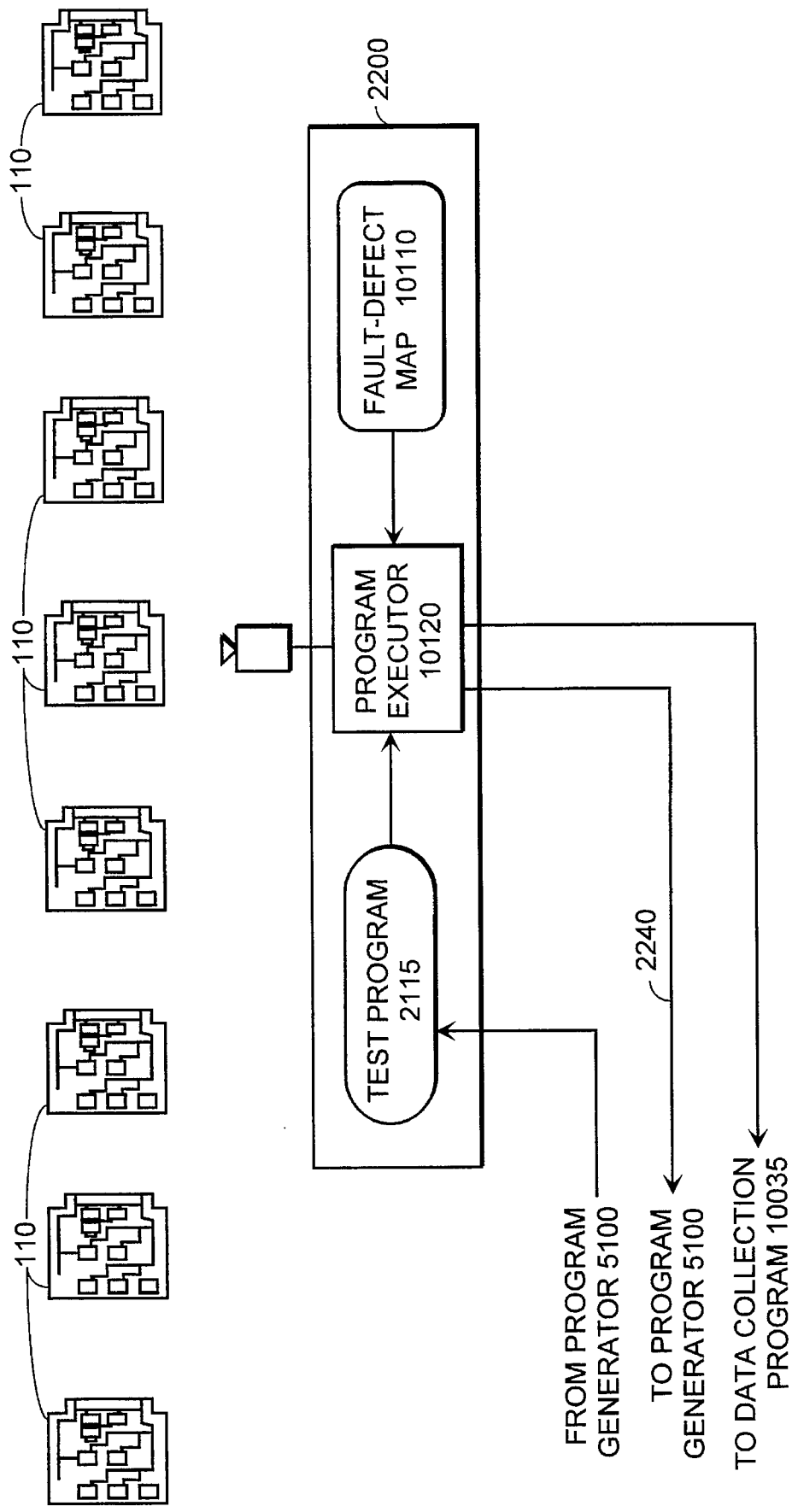

SYSTEM AND METHOD OF PROGRAMMING A MULTISTATION TESTING SYSTEM

BACKGROUND OF THE INVENTION

1. Field of the Invention

This invention relates generally to a system and method for programming a testing system, and, more particularly, to a system and method for programming a multistation system to test a circuit assembly.

2. Description of Related Art

Electronic products such as televisions typically contain one or more circuit boards manufactured by an assembly line. One method of testing a circuit board, after manufacture, is to insert the board in its product. If the product then operates, the board is deemed to be good. If the product does not operate, the board is deemed to be defective. One option in dealing with a defective board is to discard it. This option is often undesirable, however, because a board can be expensive to manufacture. Another option is to have a technician manually locate the defect on the board by probing with an oscilloscope, for example. A problem with this second option is substantial labor cost for the technicians time.

Another method of testing a circuit board, after manufacture, is to employ automatic test machines that can detect a defective board and, sometimes, automatically diagnose a board defect. It has often been desirable to employ multiple different types of test machines, each type being optimized to use certain methods to find certain kinds of defects. These different types of machines have been employed in stages, where the machine at each stage often applies test methods that are redundant with those of other stages. Thus, it has been expensive to generate programs for automatic test equipment, as substantial amounts of programmer time have been required to write and debug a test program for each machine. Testing, therefore, is often the bottleneck to releasing a new product and the most expensive step in the circuit board production process.

SUMMARY OF THE INVENTION

It is an object of the present invention to provide an efficient system for generating programs for different test machines.

To achieve this and other objects of the present invention, in a system including means for storing a plurality of rules each corresponding to a respective instruction type, each rule capable of containing a variable, a method of testing a circuit assembly, comprises the steps of receiving a description of the circuit assembly; generating, based on the description, a first test program for testing the circuit assembly by performing the following step a plurality of times for a first one of the rules: conditionally generating an instruction for the first test program, depending on a value of the variable in the rule; generating, based on the description, a second test program for testing the circuit assembly by perforating the following step a plurality of times for a second one of the rules: conditionally generating an instruction for the second test program, depending on a value of the variable in the rule; executing, at a first location, the first test program; and executing, at a second location different from the first location, the second test program, by applying a wave from a wave source, through space, and receiving some of the applied wave.

According to another aspect of the present invention, in a system including means for storing a plurality of rules each corresponding to a respective instruction type, each rule capable of containing a variable, a method of testing a circuit assembly, comprises the steps of receiving a description of the circuit assembly; generating, based on the description, a first test program for testing the circuit assembly by performing the following step a plurality of times for a first one of the rules: conditionally generating an instruction for the first test program, depending on a value of the variable in the rule; generating, based on the description, a second test program for testing the circuit assembly by performing the following step a plurality of times for a second one of the rules: conditionally generating an instruction for the second test program, depending on a value of the variable in the rule; executing the first test program by applying an electrical current to the circuit assembly, and receiving an electrical current from the circuit assembly; and executing the second test program by applying radiation to the circuit assembly, and receiving some of the applied radiation.

According to yet another aspect of the present invention, in a system including a plurality of first circuit assemblies, a plurality of second circuit assemblies, and means for storing a plurality of rules each corresponding to a respective instruction type, each rule capable of containing a rule variable, a method of testing the circuit assembly, comprises the steps of testing a plurality of first circuit assemblies, to generate defect data; receiving a description of the second circuit assembly; generating, based on the description, a first test program for testing the second circuit assembly, by performing the following steps a plurality of times for a first one of the rules: writing a value in the rule variable, using the defect data, and conditionally generating an instruction for the first test program, depending on a value of the rule variable; generating, based on the description, a second test program for testing the second circuit assembly, by performing the following step a plurality of times for a second one of the rules: writing a value in the rule variable, using the defect data, and conditionally generating an instruction for the second test program, depending on a value of the rule variable; executing, at a first location, the first test program; and executing, at a second location different from the first location, the second test program.

According to yet another aspect of the present invention, a system comprises means for storing a plurality of rules each corresponding to a respective instruction type, each rule capable of containing a variable; means for receiving a description of the circuit assembly; means for generating, based on the description, a first test program for testing the circuit assembly by performing the following step a plurality of times for a first one of the rules: conditionally generating an instruction for the first test program, depending on a value of the variable in the rule, and a second test program for testing the circuit assembly by performing the following step a plurality of times for a second one of the rules: conditionally generating an instruction for the second test program, depending on a value of the variable in the rule; means for executing, at a first location, the first test program; and means for executing, at a second location different from the first location, the second test program, by applying a wave from a wave source, through space, and receiving some of the applied wave.

According to yet another aspect of the present invention, a system comprises means for storing a plurality of rules each corresponding to a respective instruction type, each rule capable of containing a variable; means for receiving a description of the circuit assembly; means for generating, based on the description, a first test program for testing the circuit assembly by performing the following step a plurality of times for a first one of the rules: conditionally generating an instruction for the first test program, depending on a value of the variable in the rule, and a second test program for testing the circuit assembly by performing the following step a plurality of times for a second one of the rules: conditionally generating an instruction for the second test program, depending on a value of the variable in the rule; means for executing the first test program by applying an electrical current to the circuit assembly, and receiving an electrical current from the circuit assembly; and means for executing the second test program by applying radiation to the circuit assembly, and receiving some of the applied radiation.

According to yet another aspect of the present invention, a system comprises a plurality of first circuit assemblies, a plurality of second circuit assemblies; means for storing a plurality of rules each corresponding to a respective instruction type, each rule capable of containing a rule variable; means for testing a plurality of first circuit assemblies, to generating defect data; means for receiving a description of the second circuit assembly; means for generating, based on the description, a first test program for testing the second circuit assembly, by performing the following steps a plurality of times for a first one of the rules: writing a value in the rule variable, using the defect data, and conditionally generating an instruction for the first test program, depending on a value of the rule variable; a second test program for testing the second circuit assembly, by performing the following step a plurality of times for a second one of the rules: writing a value in the rule variable, using the defect data, and conditionally generating an instruction for the second test program, depending on a value of the rule variable; executing, at a first location, the first test program; and executing, at a second location different from the first location, the second test program.

BRIEF DESCRIPTION OF THE DRAWINGS

FIGS. 10A, 10B, and 10C show a flow of defect data in the preferred embodiment of the invention.

The accompanying drawings which are incorporated in and which constitute a part of this specification, illustrate embodiments of the invention and, together with the description, explain the principles of the invention, and additional advantages thereof.

DESCRIPTION OF THE PREFERRED EMBODIMENT

The preferred embodiment of the invention is a system for generating programs for a variety of testing stations. A program generator reads a common rule set to generate test instructions for an electrical tester, an optical inspector, and an x-ray inspector.

Figure 1:
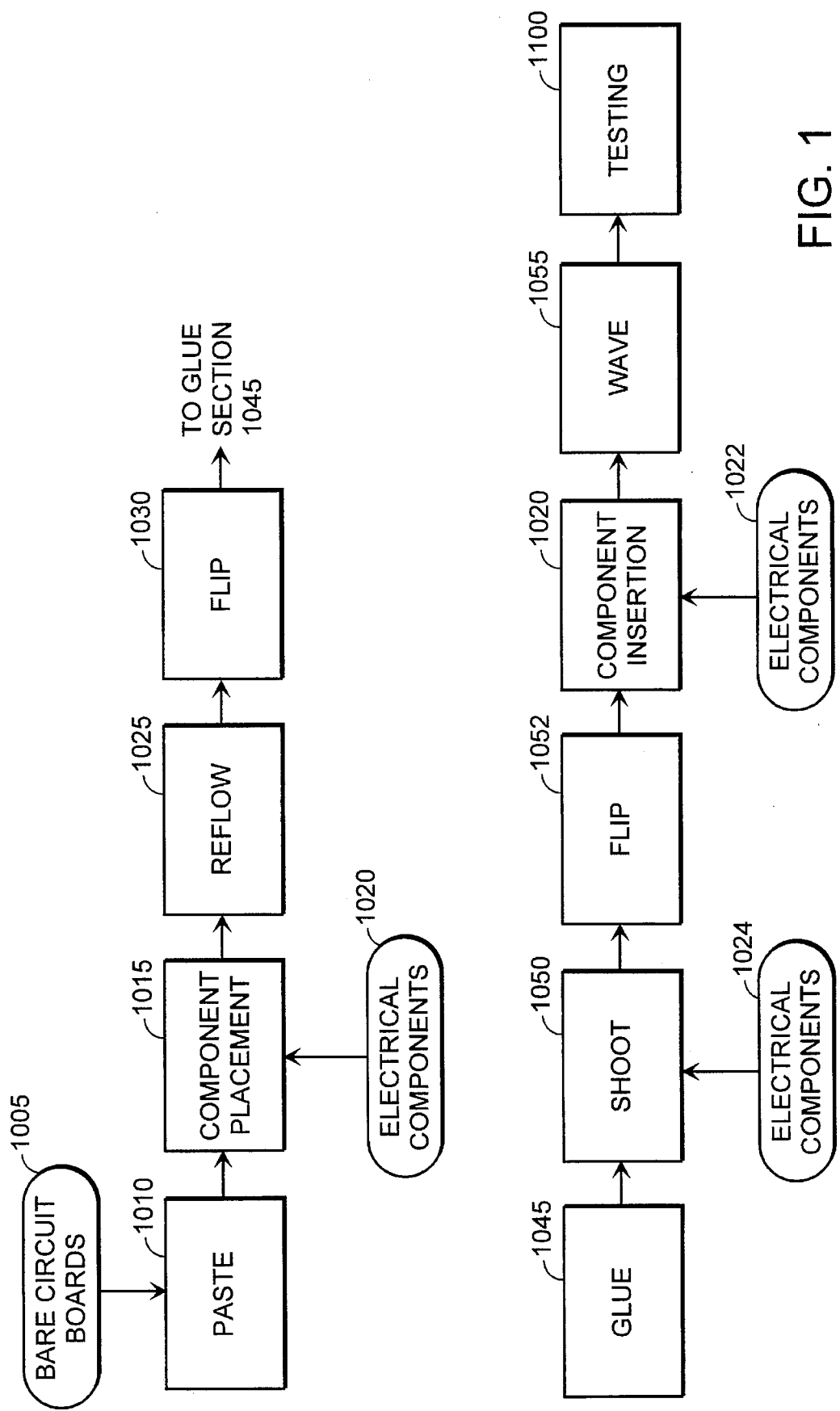
FIG. 1 is diagram of a manufacturing process incorporating the programming method of the preferred embodiment of the invention.

FIG. 1 shows a circuit board manufacturing facility according to a preferred embodiment of the present invention. Paste section 1010 receives bare circuit boards 1005 and applies paste to selected portions of the top of a board. Component placement section 1015 then receives the board and places electrical components 1020 on board locations having paste. Components 1020, 1022, and 1024 include integrated circuit (IC) packages and discrete resistors, capacitors, diodes, and transistors.

Reflow section 1025 then applies heat to melt the paste. Flip section 1030 then turns the board over to expose the other side of the board. Glue section 1045 applies glue to selected portions of the bottom of the board and shoot section 1050 applies additional components 1024 to board locations containing glue. Flip section 1052 then turns the board over to expose the other side of the board. Insertion section 1020 places additional components 1022 on top of the board by inserting components 1022 in through holes in the board. Wave solder section 1055 applies molten solder, an alloy having a low melting point, to the bottom of the board to secure components onto the board and establish electrical contact between the components and electrical paths on the board.

Figure 2A:
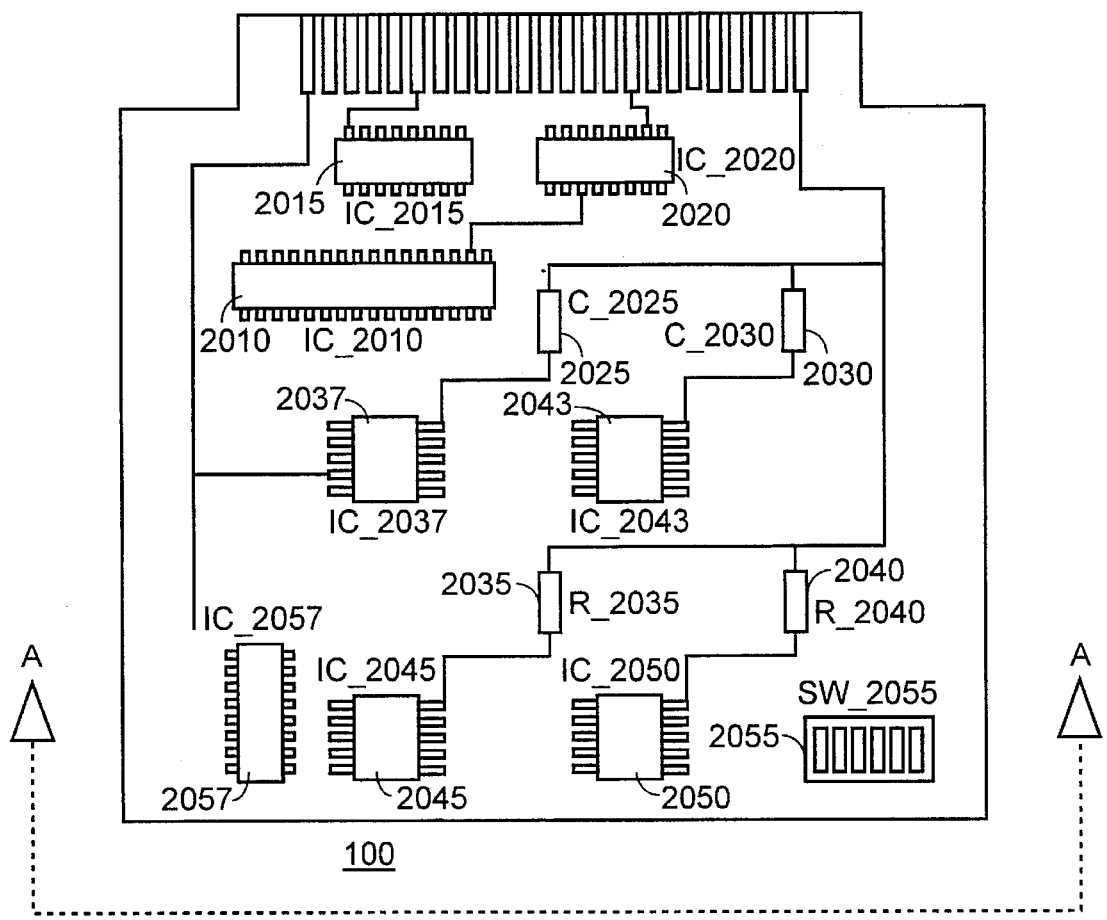
FIGS. 2A is a plan view of a circuit board produced by the process shown in FIG. 1.
Figure 2B:
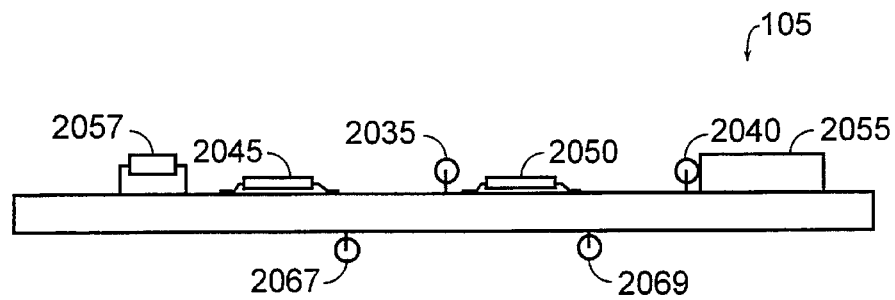
FIG. 2B is a side view of the circuit board shown in FIG. 2A.

FIG. 2A is a plan view of a television circuit board 100 after leaving wave solder section 1055, and FIG. 2B is a view of the board 100 taken along the line A-A shown in FIG. 2A. Circuit board 100 includes a top surface 105 and a bottom surface 115. These surfaces include parts 2015, 2020, 2010, 2025, 2030, 2035, 2037, 2040, 2043, 2057, 2045, 2050, 2055, 2067, and 2069. Printed on board 100 are "designators" IC__2015, IC__2020, IC__2010, C__2025, C__2030, R__2035, IC__2037, R__2040, IC__2043, IC__2057, IC__2045, IC__2050, SW__2055, R__2067, and C__2069, each corresponding to one of parts 2015, 2020, 2010, 2025, 2030, 2035, 2037, 2040, 2043, 2057, 2045, 2050, 2055, 2067, and 2069 respectively.

Testing section 1100, shown in FIG. 1, performs tests to verify that each circuit board 100 is assembled properly.

Figure 3:
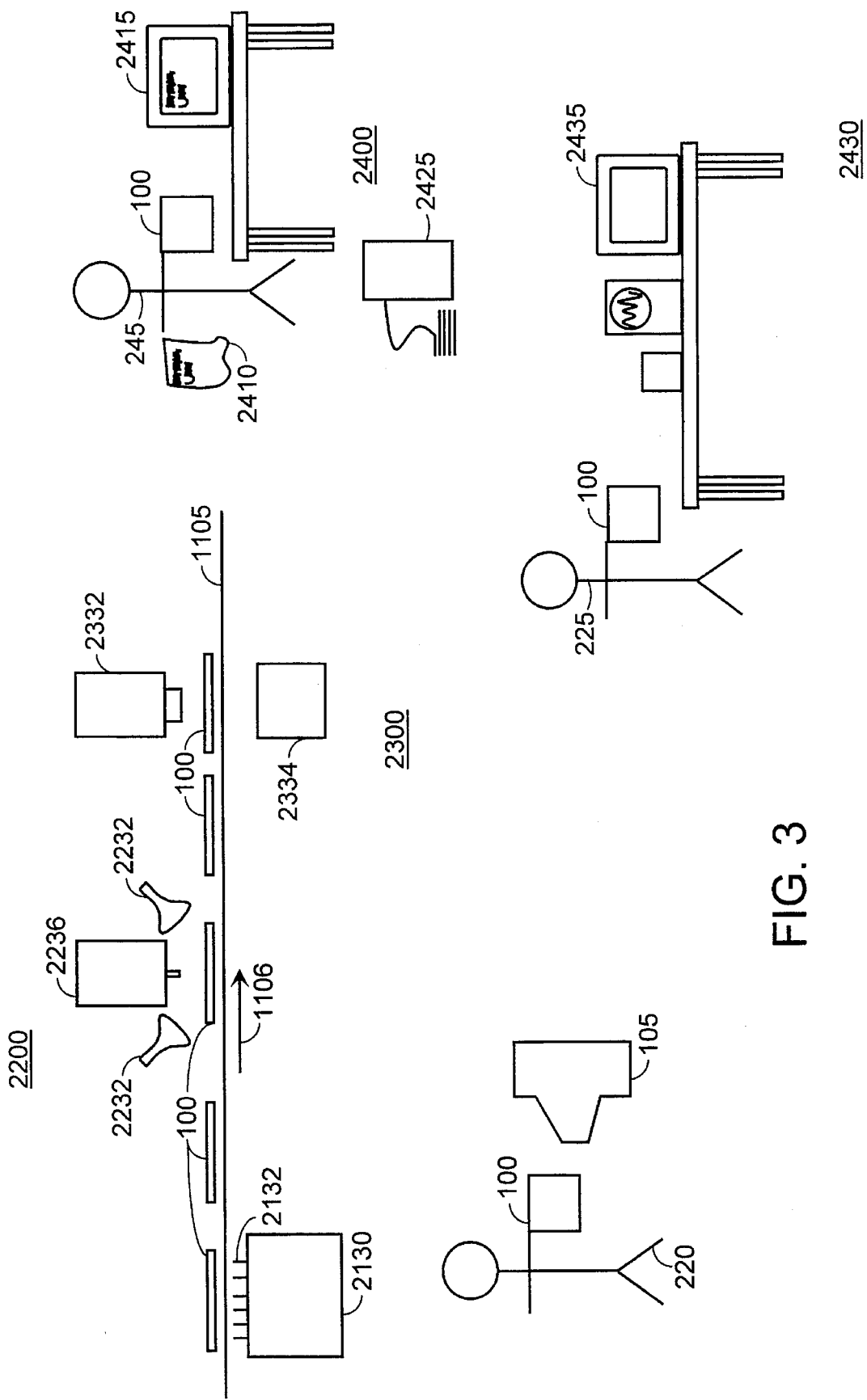
FIG. 3 is an illustration showing an aspect of the testing section shown in FIG. 1.

FIG. 3 shows testing section 1100 in more detail. Conveyor 1105 moves circuit boards 100 through various testing stations in the direction of arrow 1106. Electrical station 2130 applies electrical signals to one of the circuit boards 100 and receives electrical signals from the circuit board 100 through pins 2132. Electrical station 2130 may be any one of a variety of automatic testers now available.

Subsequently, optical station 2200 illuminates the board with lamps 2232, allowing optical recognizer 2236 to electronically photograph the board and analyze the photograph with a processor. Optical analyzer 2236 may be any one of several programmable optical inspectors now available, including one of the Theta Vision Systems available from Theta Group, Inc., 3077 A Leeman Ferry, Rd., Huntsville, Ala. 35801.

Subsequently, x-ray station 2300 irradiates the board with an x-ray source 2332 and detects x-rays passing through the board with detector 2334. X-ray station 2300 may be any one of several programmable x-ray analyzers now available, including one of the systems available from Nicolet Imaging Systems, 8221 Arjons Drive, San Diego, Calif. 92126; or from FEINFOCUS U.S.A., Inc. 5142 N. Clareton Drive, Suite 160, Agoura Hills, Calif. 91301.

If a board 100 passes all tests at stations 2100, 2200, and 2300, a board then goes to manual inspection station 2400. At manual inspection station 2400, an inspector 245 manually inspects board 100 in an attempt to detect latent defects. Inspector 245 consults a list of defects not covered by any of stations 2130, 2200, or 2300. These types of uncovered defects, called "escapes," are compiled by programming station 2100, as discussed in more detail below. Inspector 245 consults a list 2410 of escapes for board 100. List 2410 was printed by printer 2425, connected to networks 2115 (described in connection with FIG. 4). Alternatively, inspector 245 can view the escapes for board 100 on computer terminal 2415, also connected to network 2115.

Subsequently, if board 100 passes manual inspection at manual inspection 2400 a technician 220 inserts the board 100 in its respective location in television 105. If television 105 fails to operate properly after insertion of board 100, board 100 is taken to manual diagnostic station 2430, where technician 225 attempts to diagnosis the defect in the board, by manually inspecting the board and by probing with an oscilloscope, a volt meter, or a logic analyzer. After diagnosis, technician 225 enters diagnostic information into computer terminal 2435, connected to network 2115, for transmission to data collection program 10035, described in connection with FIG. 10A et seq.

Figure 4:
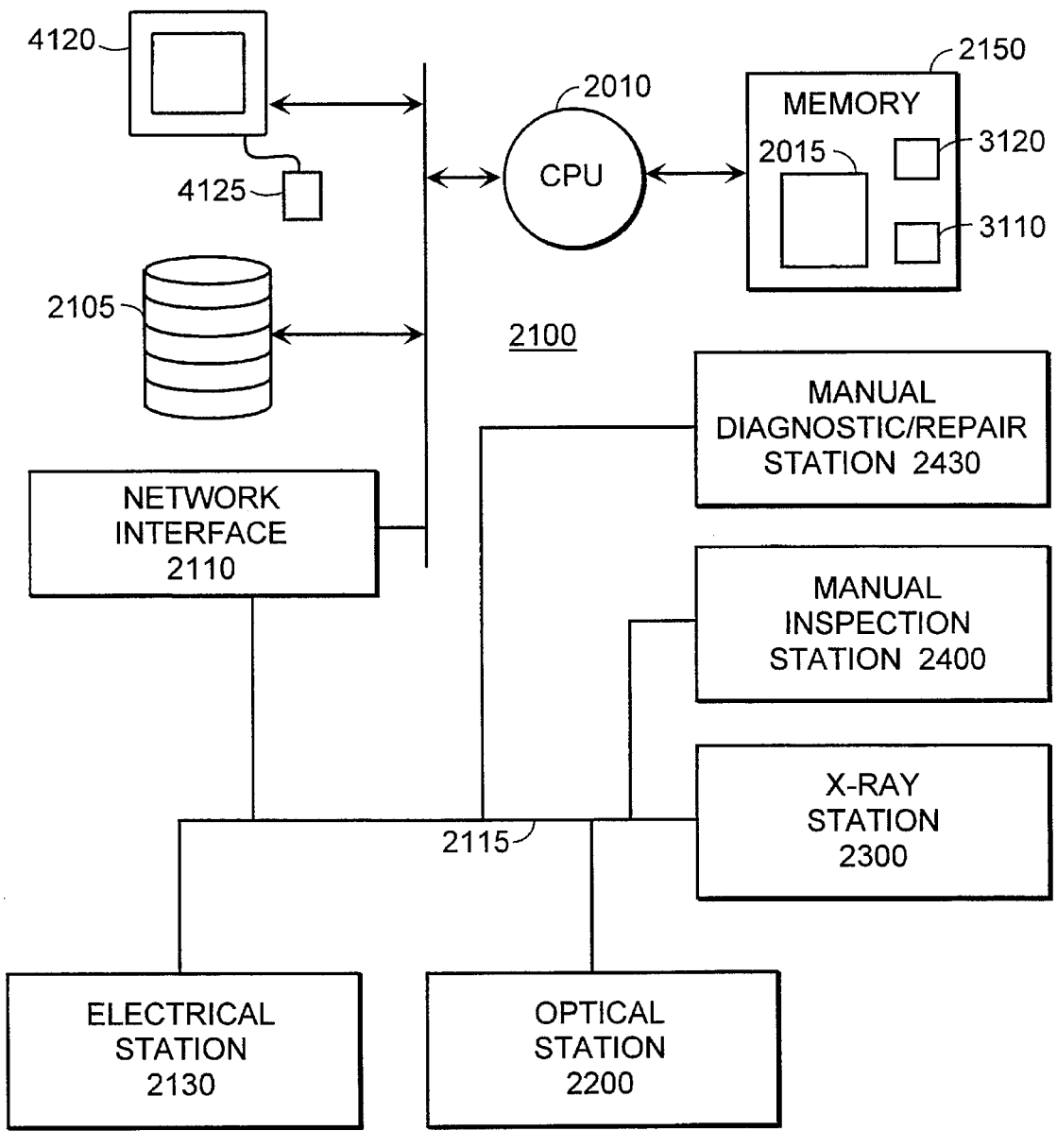
FIG. 4 is a diagram showing another aspect of the testing section.

FIG. 4 shows another aspect of testing section 1100. Programming station 2100 includes an IBM compatible PC having processor 2010, random access memory 2150, disk memory 2105 for storing programs and data, and network interface 2110. Programming station 2100 also includes a user interface having a CRT display 4120 and a mouse input device 4125.

Processor 2010 executes programs 2015 stored in memory 2150, to generate test programs for electrical station 2130, vision station 2200, and x-ray station 2300. Processor 2010 sends the generated test programs to stations 2130, 2200, and 2300 through network interface 2110. Processor 2010 also generates an uncovered defect ("escape") list, allowing inspector 245 at manual inspection station 2400 to focus on possible defects not adequately covered by any of stations 2130, 2200, and 2300.

Processor 2010 receives defect reports from manual diagnostic/repair station 2430.

In the data structures shown throughout the drawings, dotted lines represent a reference, such as a pointer, between one element and another. These references are not necessarily direct memory address pointers. Instead, more generally, each reference is a data entity, stored in association with one (referencing) element, that enables a processor to find a related (referenced) element. To physically address the referenced element, the processor may subject the reference to various translations or mappings.

Figure 5:
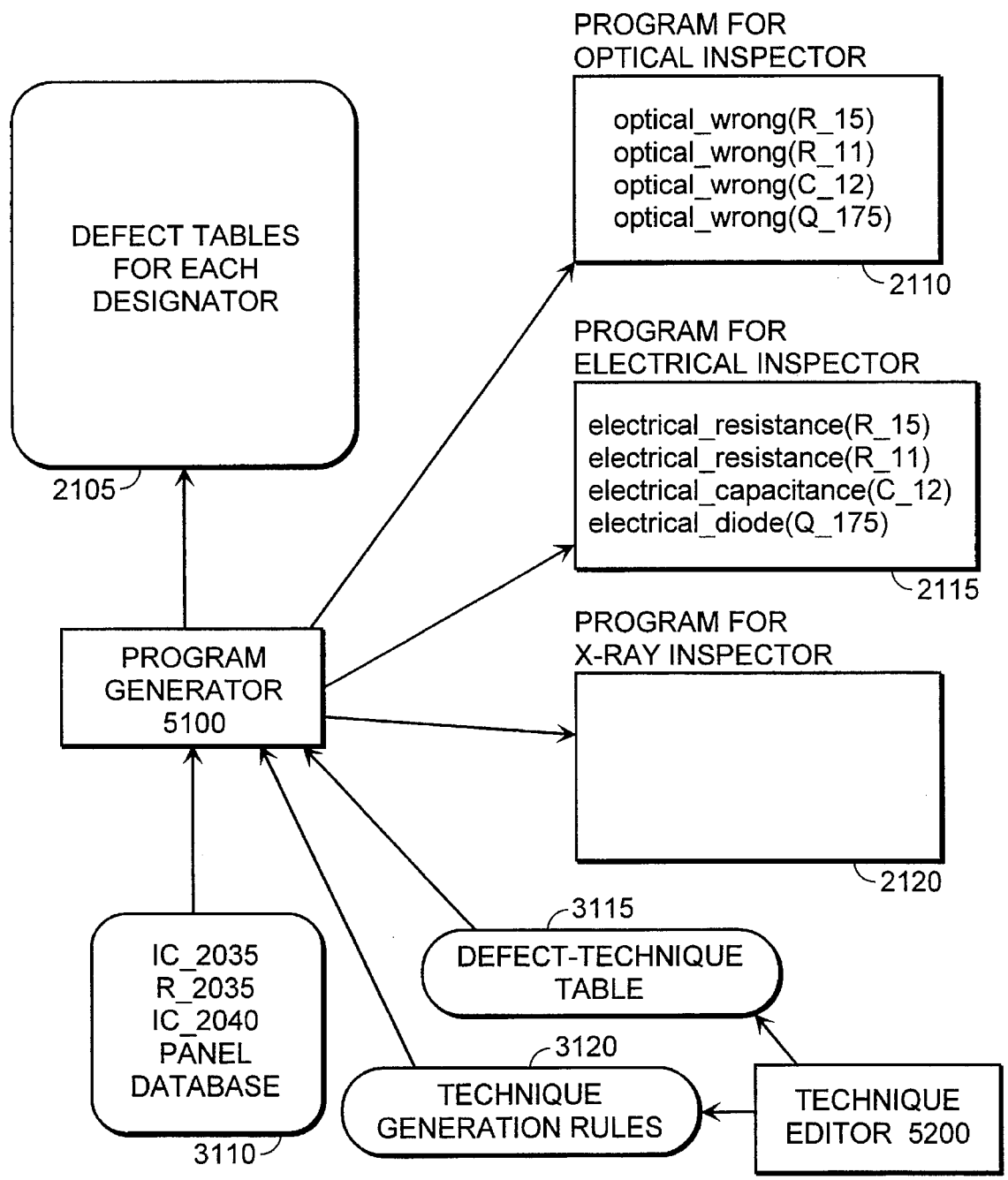
FIG. 5 is a diagram of a data flow in the testing section.

FIG. 5 shows data structures in testing system 1100, with solid lines representing a data flow between elements. "Panel" database 3110 includes a list of "designators" for board 100 and the electrical interconnection between designators. A "panel" includes one or more circuit boards manufactured on a common substrate. Panel database 3110 may include X-Y location information for electrical or optical access to a particular component, and may include X-Y location information for the component itself.

Technique generation rules 3120 control whether a particular technique will be inserted into a program. A "technique" is a type of instruction executable by a station. Table 1 below illustrates the organization of rules 3120.

In this application, a "designator" corresponds to the term "reference designator," a term commonly used to refer to a specific part on a specific printed circuit board type. As will be apparent from the description below, however, a technique performed for a particular designator name tests circuit board structure in addition to the part associated with the designator name, as interconnection to the part are also tested.

TABLE 1

| ELECTRICAL_Shorts | [condition set 1] |
|---|---|
| ELECTRICAL_Resistance | [condition set 2] |
| ELECTRICAL_OpensXpress | [condition set 3] |
| ELECTRICAL_Capacitance | [condition set 4] |
| ELECTRICAL_Inductance | [condition set 5] |
| ELECTRICAL_Transistor | [condition set 6] |
| ELECTRICAL_Diode | [condition set 7] |
| OPTICAL_Wrong | [condition set 8] |
| OPTICAL_Damaged | [condition set 9] |
| OPTICAL_Missing | [condition set 10] |
| OPTICAL_Orientation | [condition set 11] |
| OPTICAL_Skew | [condition set 12] |
| OPTICAL_SolderJoint | [condition set 13] |
| OPTICAL_Theta | [condition set 14] |
| XRAY_SolderJoint | [condition set 15] |
| ELECTRICAL_OpensXpress | [condition set 16] |
| OPTICAL_Wrong | [condition set 17] |
| ELECTRICAL_Orientation | [condition set 18] |

Each row in Table 1 is a rule that controls whether a particular technique will be generated for a particular designator. In general, multiple rules may correspond to a single technique; a single technique may have a set of rules. The left column designates a particular technique to be performed on a particular station.

Electrical station 2130 executes the electrical techniques: ELECTRICAL_Resistance, ELECTRICAL_OpensXpress, ELECTRICAL_Capacitance, ELECTRICAL_Inductance, ELECTRICAL_Transistor, and ELECTRICAL_Diode. Each of these electrical techniques includes an identification of a first pin on station 2130, through which station 2130 measures a current from the board 100 being tested. Each of these electrical techniques also includes identification of a second pin on station 2130, through which station 2130 supplies an electrical measurement signal. Thus, station 2130 measures an electrical characteristic associated with a particular designator. This characteristic may be the characteristic of a part associated with the designator.

ELECTRICAL_Shorts is a technique that takes an identifier for a group of nets on the circuit board. In the preferred system, panel database 3110 comes with a default identifier called WHOLE_BOARD, which identifies all nets on the board. The ELECTRICAL_Shorts technique performs an impedance test between nets to ensure that nets are not shorted together.

The ELECTRICAL_Resistance, ELECTRICAL_Capacitance, and ELECTRICAL_Inductance techniques measure impedances using an AC signal source.

The ELECTRICAL_Diode technique is a discrete diode test to detect the presence and proper orientation of a reversed biased PN junction.

The ELECTRICAL_Transitor technique performs the processing of two ELECTRICAL_Diode techniques to test the PN junctions between the base and collector and between the base and emitter. Alternatively, ELECTRICAL_Transitor test may be a veta test.

The ELECTRICAL_OpensXpress technique uses capacitive coupling to measure the capacitor foraged by the lead frame of a device package and a test probe placed on top of the package. The package material acts as an insulator between the probe and the lead frame. (Opens Xpress is a mark used by GenRad Inc. to describe the type of test referred to here).

The ELECTRICAL_Orientation technique employs a probe placed on top of the package, sends a signal through the probe, and detects the respective signals at each lead of the device under test. The device lead connected to the package exterior should have the larger signal, thereby indicating the orientation of the device.

Optical station 2200 executes the optical techniques: OPTICAL_Wrong, OPTICAL_Damaged, OPTICAL_Missing, OPTICAL_Orientation, OPTICAL_Skew, OPTICAL_Solder Joint, and OPTICAL_Theta. Each of these optical techniques includes x-y coordinates specifying a portion of the optical image, of board 100, to be processed by station 2200. Each optical technique also includes image data for an image to be recognized in the specified portion, and a code specifying the type of processing to be performed. For example, the OPTICAL_Theta technique attempts to recognize the image of a certain structure, such as a resistor package, within the specified image portion, and measures the orientation of the package relative to a nominal axis. In other words, each optical technique contains coordinates specifying a portion of the image of board 100 (a portion of the received radiation reflected from board 100), and contains image data corresponding to an image to be recognized.

The OPTICAL_Wrong technique performs an optical character recognition (OR) on the label printed on the device package.

The OPTICAL_Damaged, OPTICAL_Missing, OPTICAL_Orientation, OPTICAL_Skew, and OPTICAL_Theta techniques each attempt to recognize the image of a package and detect the orientation and position of the package relative some nominal position.

In other words, optical station 2200 operates by applying a wave from a wave source (lamps 2232), through a space between lamps 2232 and board 100, to board 100; optical station 2200 operates by applying electromagnetic radiation, in the form of ambient light and light from lamps 2232 to board 100. Optical recognizer 2236 receives some of the radiation (visible light) reflected from board 100. Optical station 2200 executes an optical technique by correlating image data, in the technique, with the technique-specified portion of the received radiation reflected from board 100.

X-ray station 2300 executes an x-ray technique: X-RAY_Solder Joint. This x-ray technique includes x-y coordinates specifying a portion of an x-ray image, of board 100, to be processed by station 2300. This x-ray technique also includes image data for an image to be recognized in the specified portion, and a code specifying the type of processing to be performed. This x-ray technique attempts to recognize a specified structure, such as a pattern of solder corresponding to a well-formed solder connection for a certain type of package. In other words, the X-RAY_SolderJoint technique contains coordinates specifying a portion of the image of board 100 (a portion of the received radiation passed through board 100), and contains image data corresponding to an image to be recognized.

In other words, station 2300 operates by applying radiation, using x-ray source 2332, to board 100. Station 2300 receives some of the applied radiation (x-rays) that passes through board 100, using detector 2334. Station 2300 executes the X-RAY_Solder Joint technique by correlating image data, in the technique, with the technique-specified portion of the received radiation passed through board 100.

The right column of Table 1 specifies the conditions under which the corresponding technique is inserted into a test program. Each condition set in the right column is essentially an expression for evaluation by program generator 5100. Some variables that may appear in a condition set are summarized below:

DPM (Defects Per Million) is equal to a sum of selected defect statistics associated with the designator being processed. The defect statistics associated with the designator include statistics having the stone package type and board side as the designator, as described in connection with FIG. 10A et seq. below. The selected defect statistics will be for those defects covered by the technique associated with the rule(see Table 5 below).

PACKAGE_TYPE is equal to the type of package of the part corresponding to the designator presently being processed. Possible values of PACKAGE_TYPE include FLAT PACK, GRID-ARRAY, CYLINDER, VERTICAL SURFACE-MOUNT, LONG-FORM HORIZONTAL, IN-LINE, DIP18, DIP10, DIP16, CC156, DRLY-12, SOT23F, and LED2.

PINS is equal to the number of interface contacts on the package of the part corresponding to the presently processed designator. Depending on the type of package, an interface contact may be a pin, a lead, a pad, or a ball.

PITCH is equal to the pitch between pins on the package of the part corresponding to the presently processed designator.

BOARD_SIDE is equal to TOP if the part resides on the top of the board or BOTTOM if the package resides on the bottom of the board.

DATASHEET_TYPE is equal to a certain field of an entry, in the datasheet library, corresponding to the presently processed designator, as shown in Table 7, below. Some possible values of DATASHEET_TYPE include C, R, L, IC.

For example, Table 2 shows [condition set 3] for the ELECTRICAL_OpensXpress technique:

(PIN_COUNT>=24) AND (BOARD_SIDE=TOP)   TABLE 2

In Table 2, PIN_COUNT is equal to the number of pins in a package associated with a particular "designator," and BOARD_SIDE is equal to TOP if the package resides on the top of the board or BOTTOM if the package resides on the bottom of the board. A "designator" identifies a structure on a circuit board, as described in more detail below.

Table 3 below shows [condition set 14] for the OPTICAL_THETA technique:

(PACKAGE_TYPE=LONG FORM, AXIAL, 2) AND (BOARD_SIDE=TOP)   TABLE 3

In Table 3, PACKAGE_TYPE is the name of an entry in package type library 6110. Thus, generator 5100 will generate the techniques OPTICAL_Theta (C_2025), OPTICAL_Theta (C_2030), OPTICAL_Theta (R_2035), and OPTICAL_Theta (R_2040), because the designators C_2025, C_2030, R_2035, and R_2040 each have an associated part that satisfies the conditions of Table 3.

Table 4 below shows [condition set 4] for the ELECTRICAL_Capacitance technique:

(DATASHEET_TYPE=C) AND (DPM>750)  TABLE 4

In Table 4, DPM (defects per million) represents defects statistics for the package type of the part associated with a particular designator. To process this rule, program generator 5100 inserts the ELECTRICAL_Capacitance technique into test program 2110 for any designator having both an entry in datasheet library 6015 for which the type field is C, and a package type and board side for which the sum of defects detectable by the ELECTRICAL_Capacitance technique occurs at a rate greater than 750 per million. Evaluation of the DPM variable will be described below in more detail in connection with Table 8.

Processor 2010, and one of the programs 2015, act as program generator 5100. Program generator 5100 reads database 3110 and rules 3120, and generates program 2110 for optical station 2230, generates program 2115 for electrical station 2130, and generates program 2120 for x-ray station 2300. Program generator 5100 conditionally generates a certain technique depending the corresponding condition set in rules 3120, and on the board description in database 3110.

Defect-technique table 3115 associates a technique with a set of defects, as shown in Table 5:

TABLE 5

| TECHNIQUE | FAULT | GENERIC DEFECT | CERTAINTY |
|---|---|---|---|
| ELECTRICAL_Shorts | Short | Etch Short | 100% |
| | | Solder Short | 100% |
| | | Mod Wire Misconnected | 100% |
| ELECTRICAL_Resistance | Short | Etch Short | 100% |
| | | Solder Short | 100% |
| | Value | Wrong Component | 100% |
| | Tolerance | Bad Component | 100% |
| | Open | Missing Component | 100% |
| | | Open Track | 100% |
| | | Insufficient Solder | 100% |
| | | Solder Hole/Crack/Void | 100% |
| ELECTRICAL_Capacitance | Short | Etch Short | 100% |
| | | Solder Short | 100% |
| | Value | Wrong Component | 90% |
| | Tolerance | Bad Component | 95% |
| | Open | Missing Component | |
| | | Open Track | 100% |
| | | Insufficient Solder | 100% |
| | | Solder Hole/Crack/Void | 100% |
| ELECTRICAL_Orientation | Polarity | Misoriented Component | 80% |
| ELECTRICAL_Inductance | Short | Etch Short | 100% |
| | | Solder Short | 100% |
| | Value | Wrong Component | 100% |
| | Tolerance | Bad Component | 100% |
| | Open | Missing Component | 100% |
| | | Open Track | 100% |

TABLE 5-continued

| TECHNIQUE | FAULT | GENERIC DEFECT | CERTAINTY |
|---|---|---|---|
| | | Insufficient Solder | 100% |
| | | Solder Hole/Crack/Void | 100% |
| ELECTRICAL_Diode | Value | Wrong Component | 100% |
| | | Missing Component | 100% |
| | Tolerance | Bad Component | 100% |
| ELECTRICAL_Transistor | Value | Wrong Component | 100% |
| | | Missing Component | 100% |
| | Tolerance | Bad Component | 100% |
| ELECTRICAL_OpenXpress | OpenPin | Insufficient Solder | 100% |
| | | Lifted Lead | 100% |
| | | Bent Pin | 100% |
| | | Open Track | 100% |
| | Open | Missing Component | 100% |
| | Orientation | Misoriented Component | 100% |
| OPTICAL_Wrong | Wrong Component | Wrong Component | 100% |
| OPTICAL_Damaged | Damaged | Board Damaged | 100% |
| OPTICAL_Missing | Missing | Missing Component | 100% |
| OPTICAL_Orientation | Orientation | Misoriented Component | 50% |
| OPTICAL_Skew | Offset | Misoriented Component | 100% |
| OPTICAL_SolderJoint | Bad Solder | Bad Solder | 100% |
| OPTICAL_Theta | Rotated | Misoriented Component | 100% |
| XRAY_SolderJoint | Bad Solder | Bad Solder | 100% |

In Table 5, the left column designates a technique, the second column designates possible results, called "faults," the technique can generate, and the third column designates a set of generic defects associated with a particular fault. Thus, defect-technique table 3115 relates a defect to a technique by way of a fault.

In Table 5, the fourth column designates a certainty that the technique will detect a particular defect. This certainty may be displayed with a report of defect coverage for a particular designator. It is presently preferred that Table 5 be initialized with a certainty of 100% for all defects. Subsequently, analysis of process history, including defect data and the techniques that detected the defect, can cause a particular certainty to be revised downward.

Program generator 5100 generates defect tables 5110 for a plurality of designators in panel database 3110. The possible defects for a designator include problems with a particular part associated with the designator and problems with the connection of the part.

Program generator 5100, in response to the contents of table 3115, updates defect tables to record how a technique, generated for a particular designator, relates to one or more defects.

Figure 6:
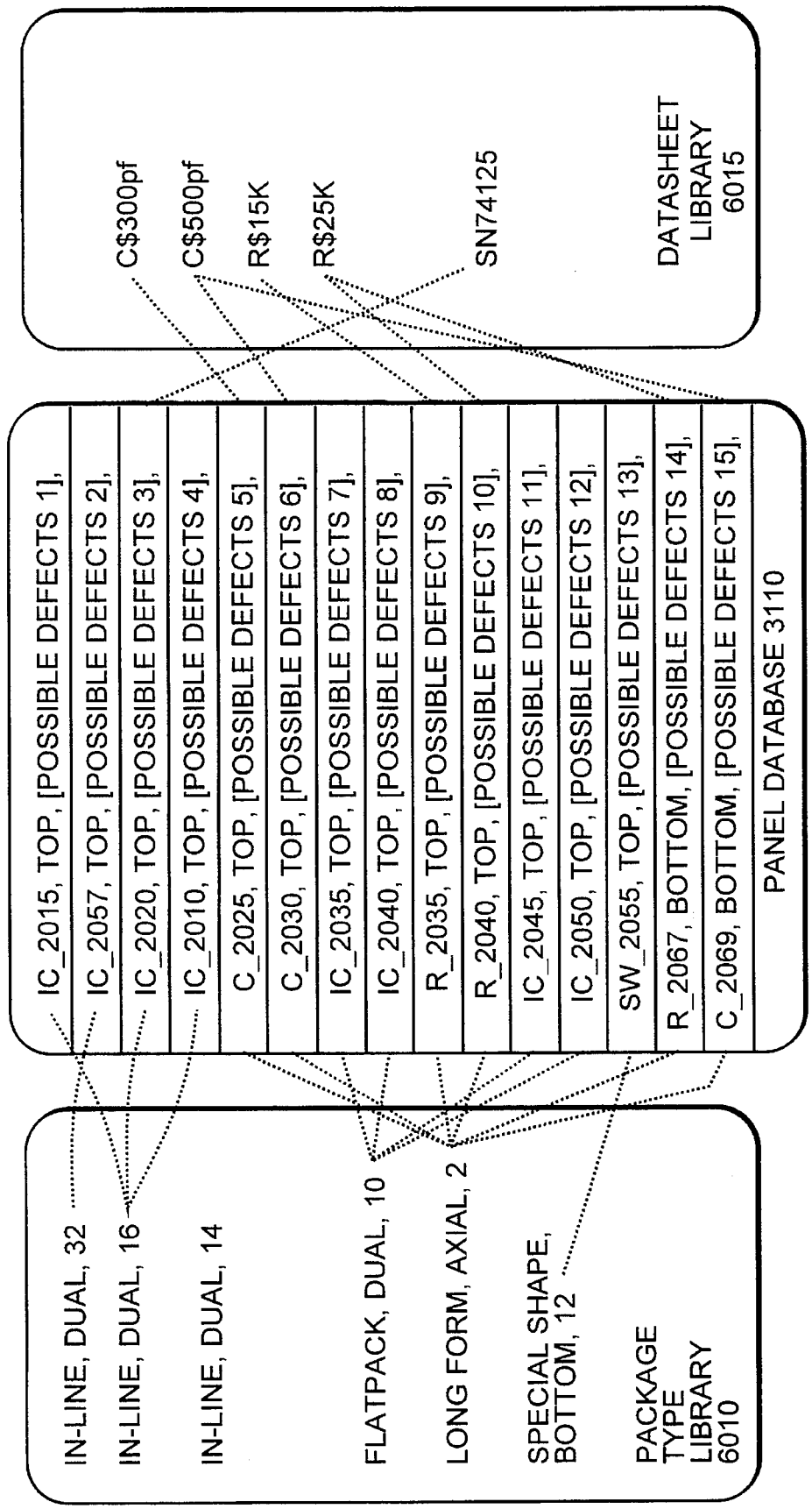
FIG. 6 is a diagram emphasizing a portion of FIG. 5.

FIG. 6 shows panel database 3110 in more detail. Panel database 3110 includes information for each designator including whether the part corresponding to the designator is on the top or bottom of the circuit board. In database 3110, each designator also has a list of possible defects, described in more detail below in connection with FIG. 7. In database 3110, each designator also includes references for associating the designator with a part. More specifically, each entry in panel database 3110 includes a reference into package type library 6010, thereby identifying the package type of the part associated with the designator. Each entry in package type library 6010 may also include pin pitch information or coordinate information for the package leads, as show for the package name DIP 18 in Table 6 below:

TABLE 6

Package Name: DIP18
Description:
Origin   Units  Height  Pitch
Center   mils   0.2     100
Number of Leads: 18

| Lead name | Lead X | Lead Y |
|---|---|---|
| 1 | .075 | 0 |
| 2 | .175 | 0 |
| 3 | .275 | 0 |
| 4 | .375 | 0 |
| 5 | .475 | 0 |
| 6 | .575 | 0 |
| 7 | .675 | 0 |
| 8 | .775 | 0 |
| 9 | .875 | 0 |
| 10 | .875 | .3 |
| 11 | .775 | .3 |
| 12 | .675 | .3 |
| 13 | .575 | .3 |
| 14 | .475 | .3 |
| 15 | .375 | .3 |
| 16 | .275 | .3 |
| 17 | .175 | .3 |
| 18 | .075 | .3 |

Each entry in panel database 3110 also includes a reference into datasheet library 6015, thereby identifying the circuit associated with the part. Table 7 below shows the library entry for the SO datasheet:

TABLE 7

Datasheet Name: SO
Description:
Guard Type: U
Datasheet Types: IC
Number of Signals: 14
Signal Name  Enable
END](pin 1)
Edge Flags: Digital-Input-Chip Select
DATA[1](pin 2)
Edge Flags: Digital-Input
Q[1](pin 3)
Edge Flags: Digital-Output-Tristate
EN[2](pin 4)
Edge Flags: Digital-Input-Chip Select
DATA[2](pin 5)
Edge Flags: Digital-Input
Q[2](pin 6)
Edge Flags: Digital-Output-Tristate
GND (pin 7)
Edge Flags: Power - Power Low
Q[3](pin 8)
Edge Flags: Digital-Output-Tristate
DATA[3](pin 9)
Edge Flags: Digital-Input
EN[3](pin 10)
Edge Flags: Digital-Input-Chip Select
Q[4](pin 11)
Edge Flags: Digital-Output-Tristate
DATA[4](pin 12)
Edge Flags: Digital-Input
EN[4](pin 13)
Edge Flags: Digital-Input-Chip Select TABLE 7-continued VCC (pin 14)
Edge Flags: Power Thus, in the preferred system, a designator identifies a structure on board 100. The structure may include a part having a certain package type and circuit. The structure may also include an electrical interconnection between the pan and the board 100. For example, when station 2100 executes the technique ELECTRICAL_Resistance (R_2040), station 2100 measures the resistance between the two fixture pins connected to board 100: the resistance of a path including both resistor 2040 and circuit board wires between these fixture pins and resistor 2040.

In FIG. 6, and in other figures and tables of this application, many data items and references have been omitted for clarity of explanation.

Figure 7:
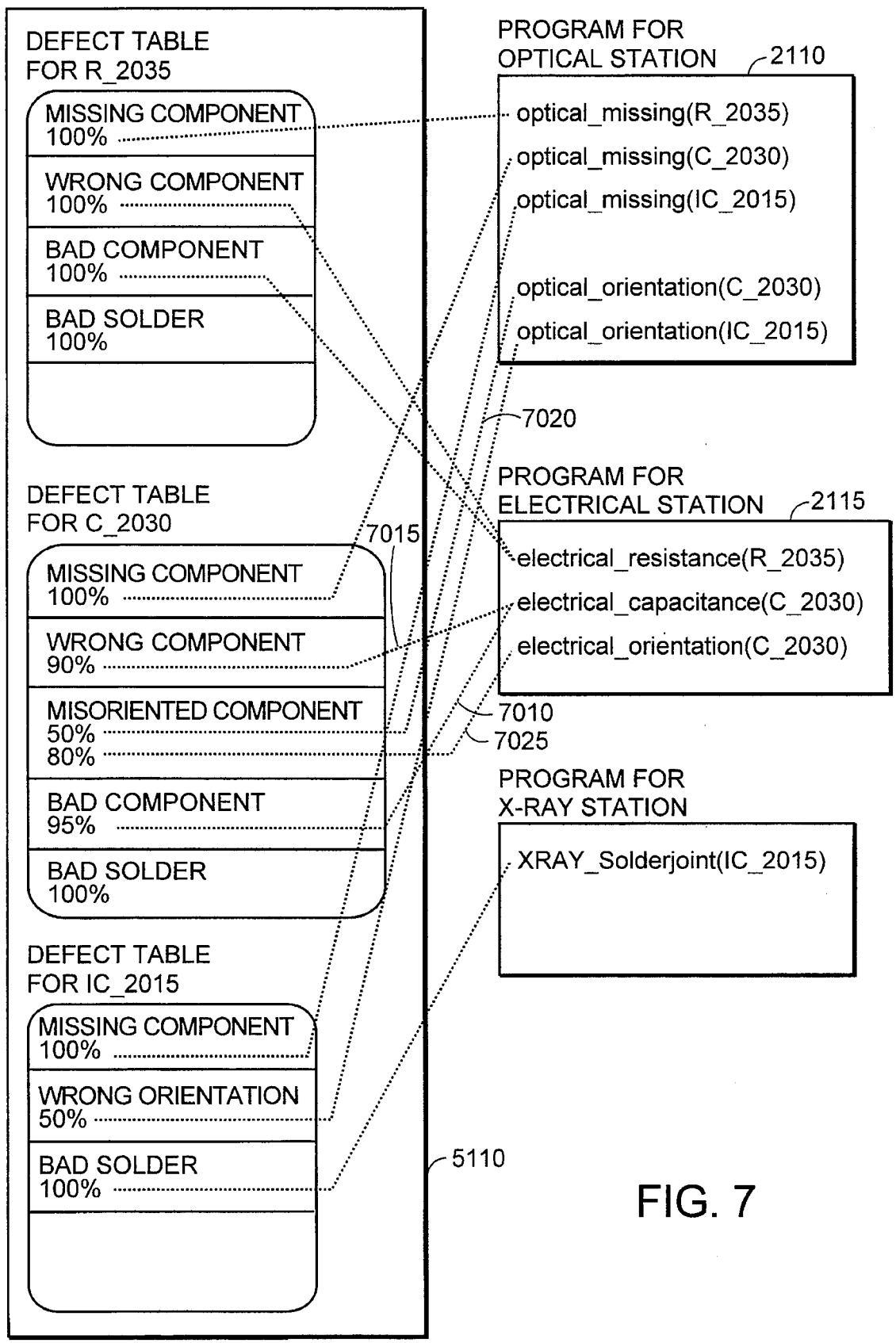
FIG. 7 is another diagram emphasizing another portion of FIG. 5.

FIG. 7 shows an aspect of program generator 5100 and tables 5110 in more detail. Each dotted line in FIG. 7 represents a double (bidirectional) reference. Program generator 5100 writes double reference 7010 for relating the bad component defect for C_2030 to the ELECTRICAL_Capacitance C_2030 technique in program 2115. In other words, dotted line 7010 represents both a reference from the ELECTRICAL_Capacitance C_2030 technique to the bad component defect for C_2030, and a reference from the bad component defect for C_2030 to the ELECTRICAL_Capacitance C_2030 technique.

Program generator 5100 also writes double reference 7015 for relating the wrong component defect for C_2030 to the ELECTRICAL_Capacitance C_2030 technique, thereby writing a relationship between a two defects and one of the techniques. Program generator 5100 also writes double reference 7020 for relating the MISORIENTED COMPONENT defect for C_2030 to the OPTICAL_Orientation C_2030 technique in program 2110, and writes double reference 7025 for relating the misoriented component defect for C_2030 to the ELECTRICAL_Orientation (C_2030) technique in program 2115, thereby writing a relationship between one defect and two techniques. Similarly, generator 5100 writes relationships between other designators (not shown in FIG. 7) and possible defects.

To generate Tables 5110, generator 5100 generates respective defect tables for each component, using the respective "possible defects" data from panel database 3110. Subsequently, as generator 5100 generates techniques, generator 5100 reads Table 5 to determine when to write a reference in a certain defect table to a certain generated technique. Along with the reference to a technique, generator 5100 also writes the corresponding certainty, read from Table 5, into table 5110.

Thus, tables 5110 store a relationship between a two defects and one of the techniques, and stores a relationship between one defect and two techniques. Similarly, table 5110 writes relationships between other designators (not shown in FIG. 7) and possible defects.

In other words, the defects in Table 5 are essentially a first signal and the "possible defects" in panel database 3110 are essentially a second signal. Table 5 stores, for each technique type, the first signal representing a defect type detectable by execution of the technique. Panel database 3110 stores the second signal representing possible defects board 100. Generator 5100 generates a plurality of instructions for testing of board 100, and generates, responsive to the first and second signals, a reference (a third signal) representing a possible defect detectable by execution of one the plurality of instructions.

The possible defects data in panel database 3110 is a function of the part corresponding to the designator (a function of the package type and data sheet corresponding to the designator).

The possible defect data is oriented by part because, although defect statistics are organized by package type, as described in more detail below, the possible defects for a part are a function of both package type and the circuit within the part. For example, although both a resistor and a capacitor may have the package type LONG FORM AXIAL, 2, an electrolytic capacitor can be mounted on a board backwards, thereby having the misoriented component defect. A resistor with this package type, however, cannot have the misoriented component defect.

Figure 8:
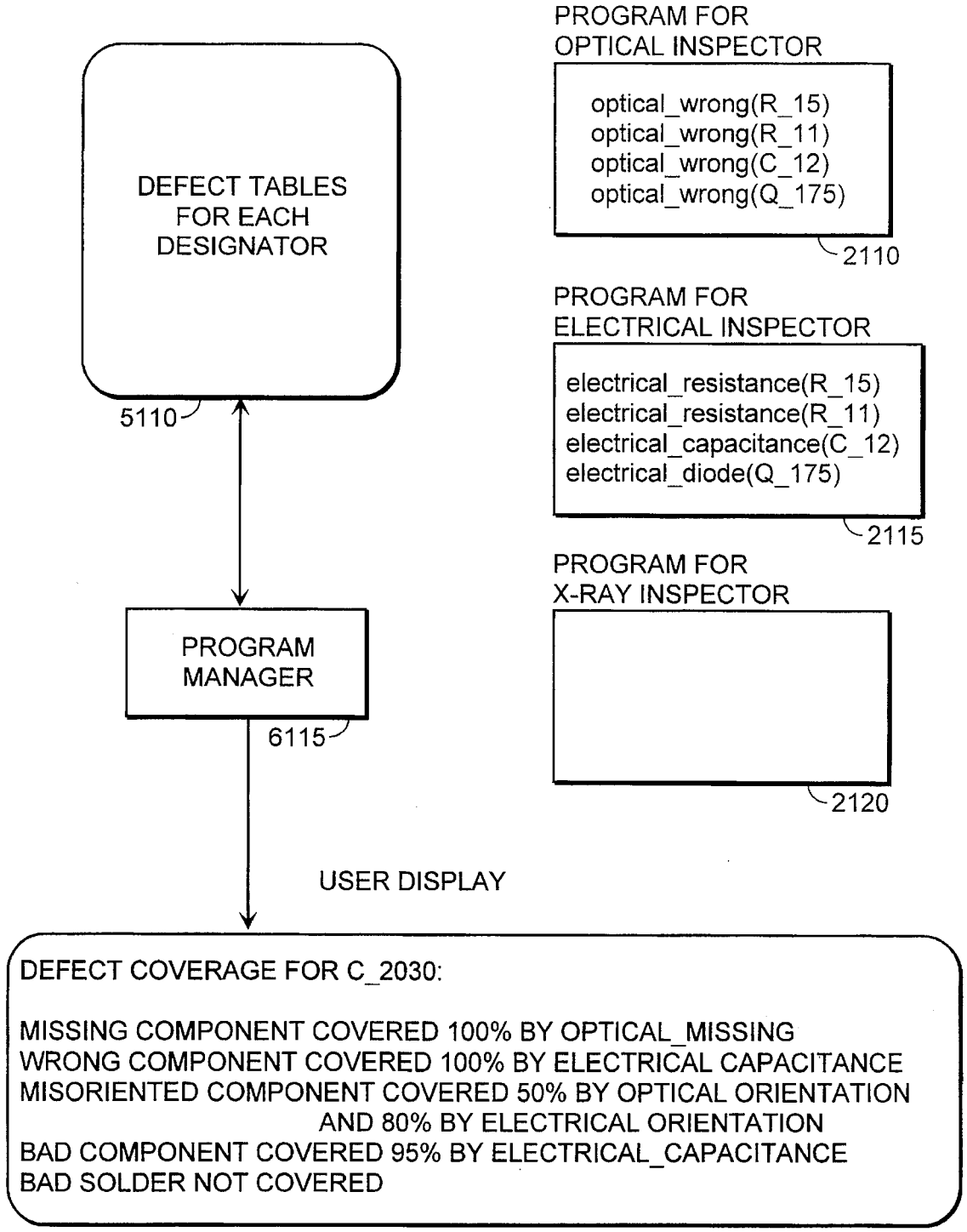
FIG. 8 is a diagram showing another data flow in the testing section.

FIG. 8 shows another data flow within testing section 1100. Processor 2010, and another one of the programs 2015, act as program manager 6115. After completion of program generation, program manager 6115 reads defect table 2105 and compiles a report of a defect coverage for designator C_2030. This report allows the user to modify the technique generation rules 3120, using technique editor 5200, to ensure appropriate defect coverage for each designator.

Generator 5100 sends a list of "escapes," defects that remain uncovered, to manual inspection station 2400.

Figure 9:
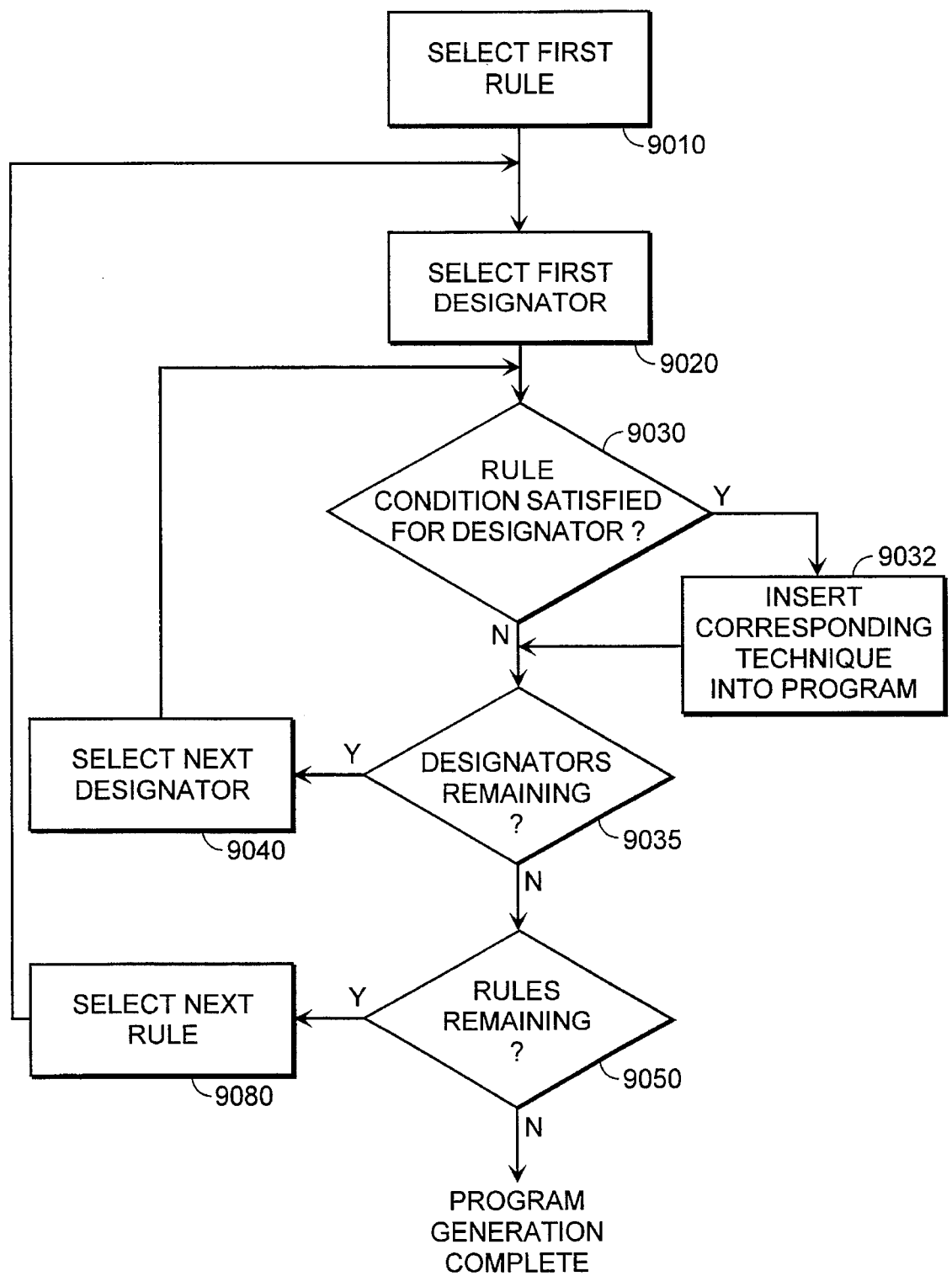
FIG. 9 is a procedural flow chart showing a processing performed by the preferred embodiment of the invention.

FIG. 9 shows a processing, performed by program generator 5100, to generate programs 2110, 2115, and 2120. Program generator 5100 selects a first rule from technique rules 3120. (step 9010). Program generator 5100 then selects a first designator from panel database 3110. (step 9020). Generator 5100 then determines whether the conditions for the presently selected rule are satisfied for the presently selected designator (step 9030). If the conditions are satisfied, generator 5100 inserts a technique for the designator into one of programs 2110, 2115, or 2120. (step 9032). If there are designators remaining to be processed for the present rule (step 9035), generator 5100 selects the next designator (step 9040) and processing proceeds to step 9030. If there are no designators remaining to be processed for the present rule (step 9035), generator 5100 determines whether there are rules remaining to be processed (step 9050). If there are rules remaining to be processed, generator 5100 selects the next rule (step 9080) and processing proceeds to step 9020.

In other words, disk memory 2105 and random access memory 2150 are each electronic memories that store rules 3120. Each rule 3120 corresponds to a respective technique type, and each rule 3120 may contain a variable (such as DPM, for example). Memories 2105 and 2150 also store panel database 3110, datasheet library 6015, and package type library 6010. Package type library 6010 may have common pin count data for first and second parts, the first part having a first circuit configuration and the second part having a circuit configuration different from the first circuit configuration. For example, designator C_2025 and C_2030 correspond to different parts, as they have different entries in datasheet library 6015, but have a common entry in package type library 6010. The entry in package type library 6010 has pin count information for the package.

Processor 2010 and one of the programs 2015 together act as program generator 5100. Program generator 5100 receives Panel database 3110, which contains a description of a circuit assembly. Program generator 5100 then generates, based on the database 3110, test program 2110 for testing the circuit assembly by performing steps 9030 and 9032, a plurality of times for each rule.

Steps 9030 and 9032 act to conditionally generate an instruction for test program 2110, depending on a value of a variable in one of the OPTICAL technique rules.

Similarly, steps 9030 and 9032 act to conditionally generate an instruction for test program 2115, depending on a value of a variable in one of the ELECTRICAL technique rules. For example, steps 9030 and 9032 conditionally generate ELECTRICAL_OpenXpress (a type of instruction) for a particular designator depending on whether the package associated with the designator has a pin count of greater than 24 (depending on a package configuration of the part associated with the designator). To determine the pin count, generator 5100 accesses a record, in package type library 6010, associated with the designator being processed.

Figure 10A:
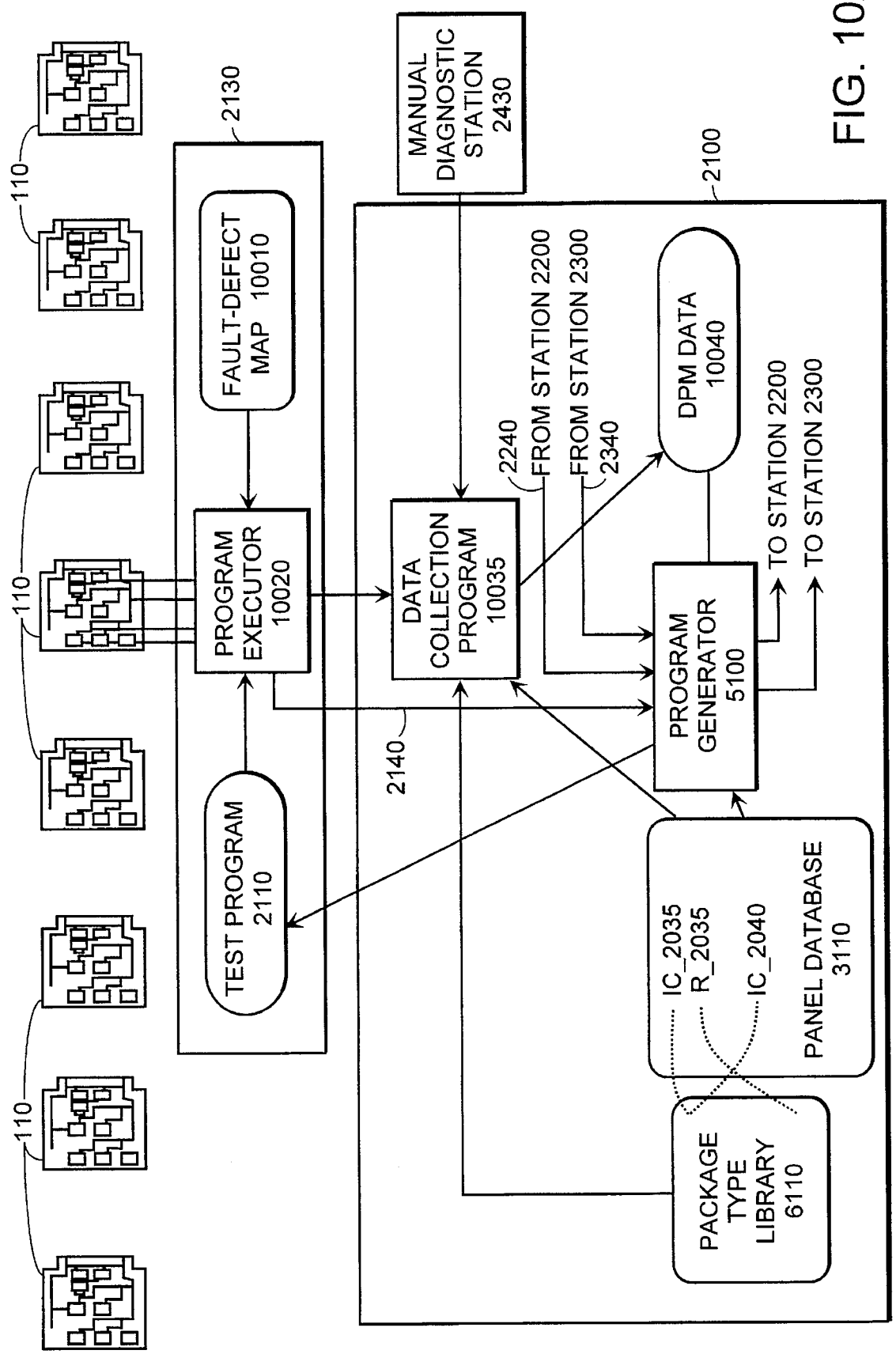
Figure 10C:
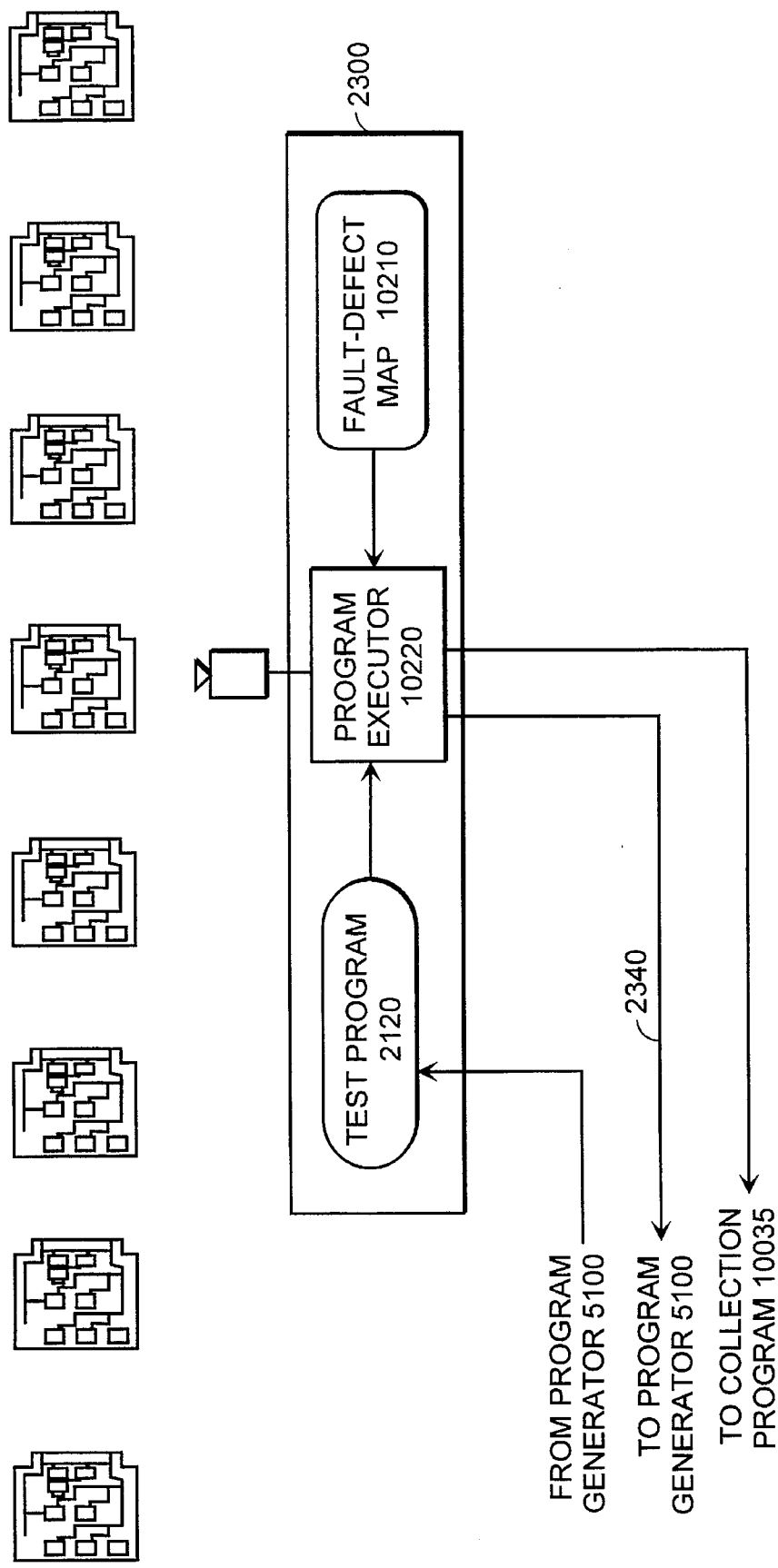

FIGS. 10A, 10B, and 10C show another aspect of testing system 1100. Over a period of time, program executor 10020, in electrical station 2130, tests a plurality of circuit boards 110. Circuit board 110 has a different collection of parts than circuit board 100, and has a different interconnection between parts than circuit board 100. Circuit board 110, however, has some package types in common with circuit board 100.

Executor 10020 tests a circuit board by executing techniques in test program 2110. When execution of a particular technique results in a fault, executor 10020 reads fault-defect map 10010 to translate the fault into list of site defects. A site defect is text describing a problem with the circuit board. Executor 10020 then sends a defect report to data collection program 10035. The defect report includes the designator of the technique that produced the fault and one or more site defects corresponding to the fault. For example, if, while testing board 78912345, execution of ELECTRICAL_CAPACITANCE (C_2030) results in the fault OPEN, executor 10020 sends the ASCII text: "BOARD 78912345, C_2030, MISSING COMPONENT or OPEN TRACK or INSUFFICIENT SOLDER or SOLDER HOLE/CRACK/VOID."

After program executor 10020 sends a defect report for a particular board, the board is sent to manual diagnostic/repair station 2430, where an operator diagnoses the actual defect on the board. Manual diagnostic/repair station 2430 then sends a defect confirmation report, for the board, to data collection program 10035. For example, station 2430 may send BOARD 78912345, C_2030, OPEN TRACK. Data collection program 10035 processes the report from station 2430 by translating the designator in the report into a package type, by accessing a data object for the designator in panel database 3110, to obtain a reference into package type library 6010. By receiving such reports over time, data collection program 10035 compiles DPM (defects per million) data 10040, which records defect rates for respective package types. Table 8 below shows an organization of DPM data 10040:

TABLE DPM

| | |
|---|---:|
| DIP18-TOP-BAD COMPONENT | 315 |
| DIP18-TOP-INSUFFICIENT SOLDER | 111 |
| DIP18-TOP-LIFTED LEAD | 518 |
| DIP18-TOP-MISSING COMPONENT | 650 |
| DIP18-TOP-OPEN TRACK | 897 |
| DIP18-BOTTOM-BAD COMPONENT | 311 |
| DIP18-BOTTOM-INSUFFICIENT SOLDER | 514 |
| DIP18-BOTTOM-LIFTED LEAD | 312 |
| DIP18-BOTTOM-MISSING COMPONENT | 897 |
| DIP18-BOTTOM-OPEN TRACK | 457 |
| INLINE,DUAL,16-TOP-BAD COMPONENT | 213 |
| INLINE,DUAL,16-TOP-INSUFFICIENT SOLDER | 517 |
| INLINE,DUAL,16-TOP-LIFTED LEAD | 311 |
| INLINE,DUAL,16-TOP-MISSING COMPONENT | 957 |
| INLINE,DUAL,16-TOP-OPEN TRACK | 1012 |
| INLINE,DUAL,16-BOTTOM-BAD COMPONENT | 37 |
| INLINE,DUAL,16-BOTTOM-INSUFFICIENT | 556 |

TABLE DPM-continued

| SOLDER | |
|---|---|
| INLINE,DUAL,16-BOTTOM-LIFTED LEAD | 427 |
| INLINE,DUAL,16-BOTTOM-MISSING COMPONENT | 312 |
| INLINE,DUAL,16-BOTTOM-OPEN TRACK | 898 |
| INLINE,DUAL,14-TOP-BAD COMPONENT | 717 |
| INLINE,DUAL,14-TOP-INSUFFICIENT SOLDER | 657 |
| INLINE,DUAL,14-TOP-LIFTED LEAD | 112 |
| INLINE,DUAL,14-TOP-MISSING COMPONENT | 131 |
| INLINE,DUAL,14-TOP-OPEN TRACK | 574 |
| INLINE,DUAL,14-BOTTOM-BAD COMPONENT | 415 |
| INLINE,DUAL,14-BOTTOM-INSUFFICIENT SOLDER | 851 |
| INLINE,DUAL,14-BOTTOM-LIFTED LEAD | 73 |
| INLINE,DUAL,14-BOTTOM-MISSING COMPONENT | 574 |
| INLINE,DUAL,14-BOTTOM-OPEN TRACK | 131 |
| LONG FORM,AXIAL,2-TOP-BAD COMPONENT | 815 |
| LONG FORM,AXIAL,2-TOP-INSUFFICIENT SOLDER | 213 |
| LONG FORM,AXIAL,2-TOP-MISSING COMPONENT | 75 |
| LONG FORM,AXIAL,2-TOP-OPEN TRACK | 75 |
| LONG FORM,AXIAL,2-TOP-BAD SOLDER | 511 |
| LONG FORM,AXIAL,2-BOTTOM-BAD COMPONENT | 205 |
| LONG FORM,AXIAL,2-BOTTOM-INSUFFICIENT SOLDER | 37 |
| LONG FORM,AXIAL,2-BOTTOM-MISSING COMPONENT | 307 |
| LONG FORM,AXIAL,2-BOTTOM-OPEN TRACK | 15 |
| LONG FORM,AXIAL,2-BOTTOM-BAD SOLDER | 511 |
| | |
| etc. | |

Following is an example of the calculation of the DPM variable for a rule for the ELECTRICAL_Capacitance technique and the designator C_2069. Because designator C_2069 has a package type of LONG FORM,AXIAL,2 located on the bottom of the board, the last five statistics in Table 8 (205, 37, 307, 15, and 511) correspond to designator C_2069. Of these five statistics, only four are detectable by the ELECTRICAL_Capacitance technique (205,37,307, and 15), since the defect BAD SOLDER is not detectable by the ELECTRICAL_Capacitance technique. Thus, the value of DPM for an ELECTRICAL_Capacitance rule processing the designator C_2069 is 564 (the sum of 205, 37, 307, and 15).

Because DPM data 10040 affects the triggering of technique generation rules that contain the variable DPM, as described above, program generator 5100 can generate a program to test board 100 using defect data generated by testing board 110.

Data collection program 10035 can be any program that receives test results and compiles defect data in an appropriate format. Similarly, although it is presently preferred that panel database 3110 be an object orientated data structure, other structures, such as electrical CAD (computer aided design) data, may be employed.

FIG. 10B shows defect data processing performed by optical station 2200. Program executor 10120 executes techniques in program 2115 to receive and process a light image reflected from circuit board 110. When a technique generates a fault, program executor 10120 reads fault-defect map 10110 to generate a defect report and send the defect report to data collection program 10035.

FIG. 10C shows defect data processing performed by x-ray station 2300. Program generator 10220 executes test program 2120 to receive x-rays passed through circuit board 110 and processed the received x rays. When execution of a technique in program 2120 generates a fault, program executor 10220 reads fault-defect map 10210 to generate a defect report and send the defect report to data collection program 10035.

In other words, the preferred system tests boards 110 (a plurality of first circuit assemblies), to generate DPM data 10040. Subsequently program generator 5100 receives panel database 3110 containing a description of board 100 (a second circuit assembly). Generator 5100 generates, based on database 3110, program 2115 (a first test program for testing the second circuit assembly), by performing the following steps a plurality of times for one of the electrical technique rules: writing a value in the DPM rule variable, using DPM data 10040; and conditionally generating a technique for program 2115, depending on the value of DPM. Generator 5100 also generates, based on database 3110, program 2110 (a second test program for testing the second circuit assembly), by preforming the following steps a plurality of times for one of the optical technique rules: writing a value in the DPM rule variable, using DPM data 10040; and conditionally generating a technique for program 2110, depending on the value of DPM.

As described above, DPM data 10040 includes a plurality of statistics, each of the boards 100 (second plurality of circuit assemblies) includes a plurality designators (structures). The step of generating, in the previous paragraph, includes step 9040 (selecting one of the designators); and selecting, from DPM data 10040, at least one statistic corresponding to the package type of the selected designator. The writing step, in the previous paragraph, includes the step of: writing a value into the DPM variable based on the selected statistic.

Thus, the preferred system coordinates test program generation, for multiple stations, to promote the most cost effective techniques for each defect on a circuit assembly. The preferred system thus optimizes defect coverage while minimizing programming costs.

Figure 11:
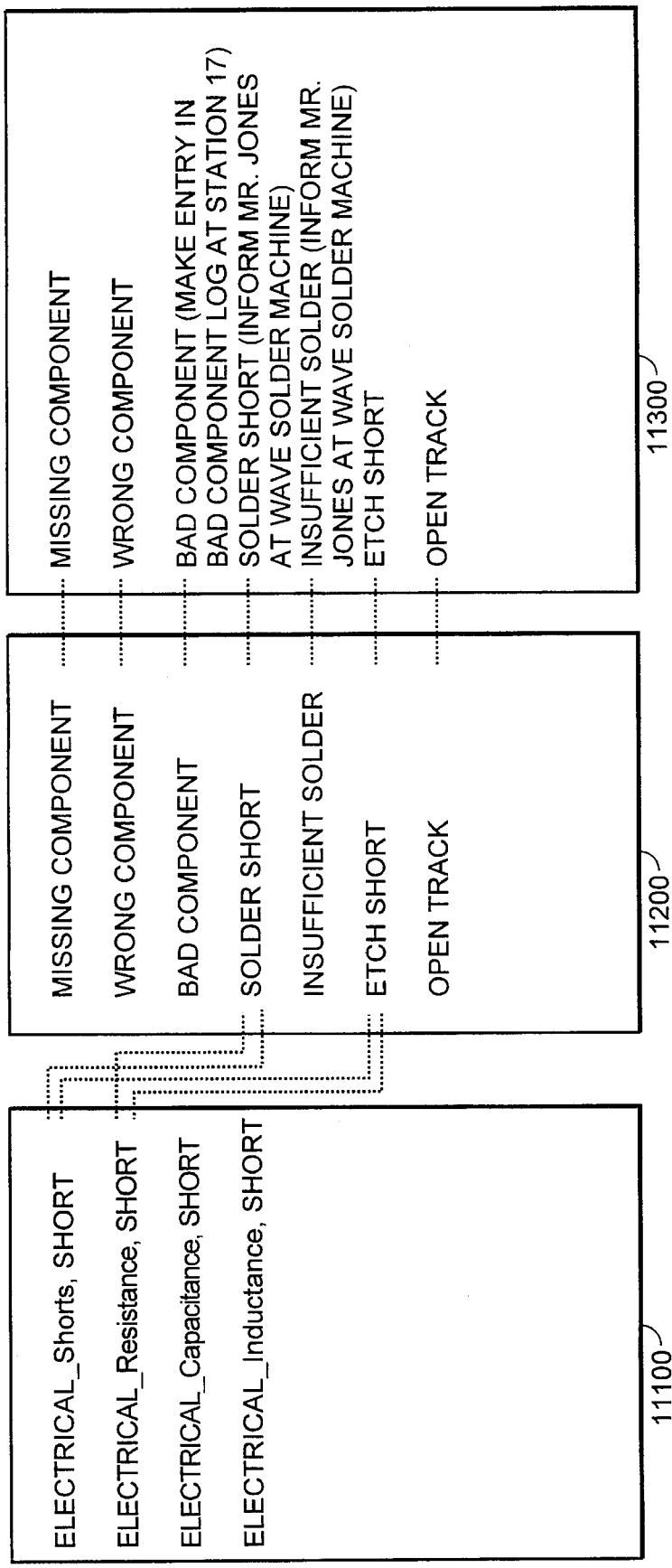
FIG. 11 shows tables for translating faults into site defects.

FIG. 11 shows an organization of fault-defect map 10010 in electrical station 2130. When technique execution generates a fault, program executor 10020 locates an entry for the fault in list 11100. The entry for the fault contains a reference into generic defect list 11200. Generic defect list 11200 contains references into site defect list 11300.

Fault-defect map 10010 is the product of processing performed on programming station 2100. More specifically, editor 5200 has a screen interface that allows the user to create the data in site defect list 11300. Editor 5200 also allows the user to adjust the references in generic defect list 11200, to complete the mapping of faults to site defects.

The combination of lists 11100, 11200, and 11300 is essentially a two layer mapping of faults to site defects. This two layer mapping allows the user to customize the site defect report to a particular site (factory) without having to define the relatively complicated mapping of faults to defect types. In other words, the mapping of generic defects to site defects will tend to be 1-to-1. The more complicated mapping of faults to generic defects can be provided by the manufacturer of programming station 2100.

Other data organizations shown in this application are also the result of processing performed on station 2100. In general, the station provides the user with screen interfaces that allow the user to create data structures and to conveniently make associations between data structures. For example, station 2100 provides a screen allowing the user to enter new designator names into the panel database. Subsequently, the station presents a screen displaying a list of designators, a list of package types, and a series of buttons allowing the user to associate a designator with a package type.

In summary, electrical station 2130 executes, at a first location, test program 2115 by applying an electrical current to one of the circuit boards 100 and receiving an electrical current from the circuit board 100. Optical station 2200 executes, at a second location different from the first location, test program 2110 by applying light to board 100 and receiving some of the applied light reflected from board 100, and x-ray station 2300 executes, at a third location different from the first and second locations, test program 2120 by applying x-rays to circuit board 100 and receiving some of the x-rays that have passed through circuit board 100.

Thus the preferred system efficiently manages a multistation testing system. Using a common rule set and circuit board description, the system generates different programs for different testers. Because the system tracks relationships between test program instructions and possible circuit assembly defects, the system can display information to allow the test programmer to efficiently distribute the total testing task over different types of testers.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims.

What is claimed is:

1. In a system including means for storing a plurality of rules each corresponding to a respective instruction type, each rule capable of containing a variable, a method of testing a circuit assembly, the method comprising the steps of:

receiving a description of the circuit assembly;

generating, based on the description, a first test program for testing the circuit assembly by performing the following step a plurality of times for a first one of the rules: conditionally generating an instruction for the first test program, depending on a value of the variable in the rule;

generating, based on the description, a second test program for testing the circuit assembly by performing the following step a plurality of times for a second one of the rules: conditionally generating an instruction for the second test program, depending on a value of the variable in the rule;

executing, at a first location, the first test program; and executing, at a second location different from the first location, the second test program, by applying a wave from a wave source, through space, and receiving some of the applied wave.

2. The method of claim 1 wherein the step of executing the first test program includes the steps of applying an electrical current to the circuit assembly; and receiving an electrical current from the circuit assembly, and the step of executing the second test program includes the steps of applying electromagnetic radiation to the circuit assembly; and receiving some of the applied electromagnetic radiation.

3. The method of claim 2 wherein the step of receiving the some of the applied radiation includes the step of receiving radiation reflected from the circuit assembly.

4. The method of claim 2 wherein the step of receiving the some of the applied radiation includes the step of receiving radiation passed through the circuit assembly.

5. The method of claim 2 wherein the step of receiving the some of the applied radiation includes the step of correlating the received radiation with a stored image.

6. In a system including means for storing a plurality of rules each corresponding to a respective instruction type, each rule capable of containing a variable, a method of testing a circuit assembly, the method comprising the steps of:

receiving a description of the circuit assembly;

generating, based on the description, a first test program for testing the circuit assembly by performing the following step a plurality of times for a first one of the rules: conditionally generating an instruction for the first test program, depending on a value of the variable in the rule;

generating, based on the description, a second test program for testing the circuit assembly by perforating the following step a plurality of times for a second one of the rules: conditionally generating an instruction for the second test program, depending on a value of the variable in the rule;

executing the first test program by applying an electrical current to the circuit assembly, and receiving an electrical current from the circuit assembly; and executing the second test program by applying radiation to the circuit assembly, and receiving some of the applied radiation.

7. In a system including a plurality of first circuit assemblies, a plurality of second circuit assemblies, and means for storing a plurality of rules each corresponding to a respective instruction type, each rule capable of containing a rule variable, a method of testing the circuit assembly, the method comprising the steps of:

testing a plurality of first circuit assemblies, to generate defect data;

receiving a description of the second circuit assembly;

generating, based on the description, a first test program for testing the second circuit assembly, by performing the following steps a plurality of times for a first one of the rules:

writing a value in the rule variable, using the defect data, and conditionally generating an instruction for the first test program, depending on a value of the rule variable;

generating, based on the description, a second test program for testing the second circuit assembly, by performing the following step a plurality of times for a second one of the rules:

writing a value in the rule variable, using the defect data, and conditionally generating an instruction for the second test program, depending on a value of the rule variable;

executing, at a first location, the first test program; and executing, at a second location different from the first location, the second test program.

8. The method of claim 7 wherein the defect data includes a plurality of statistics, each of the second plurality of circuit assemblies includes a plurality of structures and the step of generating includes the steps of selecting one of the structures;

selecting, from the plurality of statistics, a statistic corresponding to the selected structure, and the writing step includes the step of:

writing a value based on the selected statistic.

9. The method of claim 8 wherein the step of selecting a statistic includes the step of selecting a statistic corresponding to a package type of the selected structure.

10. A system comprising:

means for storing a plurality of rules each corresponding to a respective instruction type, each rule capable of containing a variable;

means for receiving a description of the circuit assembly;

means for generating, based on the description, a first test program for testing the circuit assembly by performing the following step a plurality of times for a first one of the rules: conditionally generating an instruction for the first test program, depending on a value of the variable in the rule, and a second test program for testing the circuit assembly by performing the following step a plurality of times for a second one of the rules: conditionally generating an instruction for the second test program, depending on a value of the variable in the rule;

means for executing, at a first location, the first test program; and means for executing, at a second location different from the first location, the second test program, by applying a wave from a wave source, through space, and receiving some of the applied wave.

11. The system of claim 10 wherein the means for executing the first test program includes means for applying an electrical current to the circuit assembly; and means for receiving an electrical current from the circuit assembly, and the means for executing the second test program includes means for applying radiation to the circuit assembly; and means for receiving some of the applied radiation.

12. The system of claim 11 wherein the means for receiving the some of the applied radiation includes means for receiving radiation reflected from the circuit assembly.

13. The system of claim 11 wherein the means for receiving the some of the applied radiation includes means for receiving radiation passed through the circuit assembly.

14. The system of claim 11 wherein the means for receiving the some of the applied radiation includes means for correlating the received radiation with a stored image.

15. A system comprising:

means for storing a plurality of rules each corresponding to a respective instruction type, each rule capable of containing a variable;

means for receiving a description of the circuit assembly;

means for generating, based on the description, a first test program for testing the circuit assembly by performing the following step a plurality of times for a first one of the rules: conditionally generating an instruction for the first test program, depending on a value of the variable in the rule, and a second test program for testing the circuit assembly by performing the following step a plurality of times for a second one of the rules: conditionally generating an instruction for the second test program, depending on a value of the variable in the rule;

means for executing the first test program by applying an electrical current to the circuit assembly, and receiving an electrical current from the circuit assembly; and means for executing the second test program by applying radiation to the circuit assembly, and receiving some of the applied radiation.

16. A system comprising:

a plurality of first circuit assemblies, a plurality of second circuit assemblies;

means for storing a plurality of rules each corresponding to a respective instruction type, each rule capable of containing a rule variable;

means for testing a plurality of first circuit assemblies, to generating defect data;

means for receiving a description of the second circuit assembly;

means for generating, based on the description, a first test program for testing the second circuit assembly, by performing the following steps a plurality of times for a first one of the rules:

writing a value in the rule variable, using the defect data, and conditionally generating an instruction for the first test program, depending on a value of the rule variable;

a second test program for testing the second circuit assembly, by performing the following step a plurality of times for a second one of the rules:

writing a value in the rule variable, using the defect data, and conditionally generating an instruction for the second test program, depending on a value of the rule variable;

executing, at a first location, the first test program; and executing, at a second location different from the first location, the second test program.

17. The system of claim 16 wherein the defect data includes a plurality of statistics, each of the second plurality of circuit assemblies includes a plurality of structures and the means for generating includes means for selecting one of the structures;

means for selecting, from the plurality of statistics, a statistic corresponding to the selected structure, and the writing step includes:

means for writing a value based on the selected statistic.

18. The system of claim 17 wherein the means for selecting a statistic includes means for selecting a statistic corresponding to a package type of the selected structure.

* * * * *